United States Patent
Molas et al.

(10) Patent No.: US 12,224,007 B2
(45) Date of Patent: Feb. 11, 2025

(54) METHOD FOR DETERMINING A MANUFACTURING PARAMETER OF A RESISTIVE RANDOM ACCESS MEMORY CELL

(71) Applicants: COMMISSARIAT À L'ÉNERGIE ATOMIQUE ET AUX ÉNERGIES ALTERNATIVES, Paris (FR); WEEBIT NANO LTD, Hod-Hasharon (IL)

(72) Inventors: Gabriel Molas, Grenoble (FR); Guiseppe Piccolboni, Verona (IT); Amir Regev, Modiin (IL); Gaël Castellan, Grenoble (FR); Jean-François Nodin, Grenoble (FR)

(73) Assignees: COMMISSARIAT À L'ENERGIE ATOMIQUE ET AUX ÉNERGIES ALTERNATIVES, Paris (FR); WEEBIT NANO LTD, Hod-Hasharon (IL)

( * ) Notice: Subject to any disclaimer, the term of this patent is extended or adjusted under 35 U.S.C. 154(b) by 154 days.

(21) Appl. No.: 17/618,250

(22) PCT Filed: Jun. 11, 2020

(86) PCT No.: PCT/EP2020/066240
§ 371 (c)(1),
(2) Date: Dec. 10, 2021

(87) PCT Pub. No.: WO2020/249697
PCT Pub. Date: Dec. 17, 2020

(65) Prior Publication Data
US 2022/0336017 A1    Oct. 20, 2022

(30) Foreign Application Priority Data
Jun. 12, 2019 (FR) .................................. 1906259

(51) Int. Cl.
*G11C 13/00* (2006.01)
*H10N 70/00* (2023.01)

(52) U.S. Cl.
CPC ....... *G11C 13/0069* (2013.01); *H10N 70/026* (2023.02); *H10N 70/841* (2023.02); *H10N 70/883* (2023.02)

(58) Field of Classification Search
CPC ............. G11C 13/0069; H10N 70/883; H10N 70/026; H10N 70/841
See application file for complete search history.

(56) References Cited

U.S. PATENT DOCUMENTS 9,000,506 B2 *  4/2015  Ninomiya .......... H10N 70/8833
                                                     257/306
9,082,968 B2 *  7/2015  Mikawa ............... H10N 70/063
(Continued)

FOREIGN PATENT DOCUMENTS

CN    101562229 A    10/2009
FR    3 061 799 A1    7/2018
(Continued)

OTHER PUBLICATIONS

International Search Report as issued in International Patent Application No. PCT/EP2020/066240, dated Aug. 7, 2020.
(Continued)

*Primary Examiner* — Vanthu T Nguyen
(74) *Attorney, Agent, or Firm* — Pillsbury Winthrop Shaw Pittman LLP (57) ABSTRACT

A method for determining a value of a manufacturing parameter of a resistive memory cell, the resistive memory cell including a stack of layers, includes providing reference memory cells corresponding to technological alternatives of the stack of layers; measuring for each reference memory cell an initial resistance value; determining for each refer-
(Continued)

ence memory cell a programming parameter value selected from among the resistance in a high resistance state and the programming window; establishing a relationship between the programming parameter and the initial resistance from the initial resistance values and the programming parameter values; and determining the manufacturing parameter value for which the programming parameter is greater than or equal to a target value, from the relationship between the programming parameter and the initial resistance and from a dependency relationship between the initial resistance and the manufacturing parameter.

10 Claims, 3 Drawing Sheets

(56) References Cited

U.S. PATENT DOCUMENTS

| | | | |
|---|---|---|---|
| 9,269,898 | B2 | 2/2016 | Maxwell et al. |
| 9,847,130 | B1 | 12/2017 | Jo |
| 2011/0095255 | A1 | 4/2011 | Sumino et al. |
| 2012/0223284 | A1 | 9/2012 | Tamai |
| 2012/0292589 | A1 | 11/2012 | Yoneda et al. |
| 2013/0001504 | A1 | 1/2013 | Ninomiya et al. |
| 2013/0064002 | A1 | 3/2013 | Terai |
| 2013/0082230 | A1 | 4/2013 | Katayama et al. |
| 2013/0264536 | A1 | 10/2013 | Tour et al. |
| 2014/0312293 | A1 | 10/2014 | Mikawa et al. |
| 2016/0020388 | A1* | 1/2016 | Wang .......... H10N 70/826 257/3 |
| 2016/0276411 | A1 | 9/2016 | Tour et al. |
| 2016/0351256 | A1 | 12/2016 | Xia |

FOREIGN PATENT DOCUMENTS

| | | |
|---|---|---|
| JP | 2016-076655 A | 5/2016 |
| WO | WO 2012/071100 A1 | 5/2012 |
| WO | WO 2015/179593 A1 | 11/2015 |

OTHER PUBLICATIONS

Bricalli, A., et al., "SiOx-based resistive switching memory (RRAM) for crossbar storage/select elements with high on/off ratio," IEEE, (2016), 4 pages.

Non-Final Office Action as issued in U.S. Appl. No. 17/618,295, dated Sep. 22, 2023.

Bricalli, A., et al., "Resistive Switching Device Technology Based on Silicon Oxide for Improved On-Off Ratio—Part I: Memory Devices", pp. 115-121, IEEE Transactions on Electron Devices, vol. 65, No. 1, Jan. 2018. (Year: 2018).

Final Office Action as issued in U.S. Appl. No. 17/618,295, dated Feb. 28, 2024.

Non-Final Office Action as issued in U.S. Appl. No. 17/618,295, dated Sep. 6, 2024.

* cited by examiner

METHOD FOR DETERMINING A MANUFACTURING PARAMETER OF A RESISTIVE RANDOM ACCESS MEMORY CELL

CROSS-REFERENCE TO RELATED APPLICATIONS

This application is the U.S. National Stage of PCT/EP2020/066240, filed Jun. 11, 2020, which in turn claims priority to French patent application number 1906259 filed Jun. 12, 2019. The content of these applications are incorporated herein by reference in their entirety.

TECHNICAL FIELD

The present invention pertains to the field of resistive random access memories (RRAM). The invention relates to a method for determining a value of one or more manufacturing parameters of a resistive memory cell, with the aim of improving the programming window of the resistive memory cell. The invention also relates to a method for manufacturing a resistive memory cell having a large programming window.

PRIOR ART

Resistive memories, in particular oxide-based random access memories (OxRAM), are non-volatile memories having the aim of replacing Flash type memories. In addition to high integration density, they have fast operating speeds, high endurance and good compatibility with the manufacturing methods currently used in the microelectrics industry, in particular with the back-end of line (BEOL) method of CMOS technology.

OxRAM resistive memories comprise a multitude of memory cells, also called memory points. Each OxRAM memory cell is constituted of a M-I-M (Metal-Insulator-Metal) capacitance comprising an active material with variable electrical resistance, in general a transition metal oxide (e.g. $HfO_2$, $Ta_2O_5$, $TiO_2$ ... ), arranged between two metal electrodes. The memory cell switches, in a reversible manner, between two resistance states, which correspond to the logic values "0" and "1" used to encode an information bit. In certain cases, more than two resistance states may be generated, which makes it possible to store several information bits in a same memory cell.

The information is written in the memory cell by switching it from a high resistance state (HRS), also called "OFF" state, to a low resistance state (LRS), or "ON" state. Conversely, to erase the information of the memory cell, it is switched from the low resistance state ("OFF") to the high resistance state ("ON").

The change in resistance of the memory cell is governed by the formation and the rupture of a conductive filament of nanometric section between the two electrodes.

Immediately after its manufacture, the resistive memory cell is in a virgin state characterised by a very high (so-called initial) resistance, much greater than the resistance of the cell when it is in the high resistance state. The oxide layer is in fact insulating in its initial state. In order that the memory cell can be used, it is necessary to accomplish a so-called "forming" step. This step consists in a partially reversible breakdown of the oxide in order to generate for the first time the conductive filament (and thus place the memory cell in the low resistance state). After this breakdown, the initially insulating oxide layer becomes active and the cell can switch between the low resistance state and the high resistance state by erasing and writing operations.

The forming step is accomplished by applying between the two electrodes of the memory cell a voltage (so-called "forming" voltage) of much greater value than the nominal operating voltage of the memory cell (used during the following writing-erasing cycles), for example a voltage of the order of 2.5 V for a nominal voltage of the order of 1.5 V. To obtain a forming voltage compatible with the supply voltage of the circuit to which the memory cell belongs, one solution consists in adjusting certain manufacturing parameters of the memory cell. For example, the forming voltage may be increased by increasing the thickness of the oxide layer or by decreasing the thickness of the electrodes.

A drawback of OxRAM resistive memories is the great variability of the electrical resistance of a memory cell in the high resistance state. This variability is observed not only in the course of writing-erasing cycles on a same cell, but also from cell to cell.

This problem of variability of the electrical resistance is a real brake to industrialisation, because it induces a reduction in the programming window, defined as the ratio between the resistance in the high resistance state and the resistance in the low resistance state. Consequently, there exists a risk of losing the information stored in the memory cell. This worry remains despite numerous efforts made in the fields of the programming of OxRAM resistive memories. Indeed, the shape, the duration and the maximum amplitude of the programming pulses may be selected with the aim of maximising the programming window over the greatest possible number of writing-erasing cycles.

Furthermore, studies have been carried out recently in order to replace transition metal oxides by cheaper and more easily industrialisable materials: silicon oxides. The document US2016/276411 describes a matrix of memory cells each comprising a layer of resistive material based on sub-stoichiometric silicon oxide ($SiO_x$, with x comprised between 1 and 2) arranged between two electrodes, for example made of titanium.

SUMMARY OF THE INVENTION

The invention has the aim of providing an additional means of optimising the programming window of a resistive memory cell, for example of a silicon oxide based cell.

According to a first aspect of the invention, one tends towards this objective by providing a method for determining at least one value of at least one manufacturing parameter of a resistive memory cell, the resistive memory cell comprising a stack of thin layers, said method comprising the following steps:
- providing several reference memory cells corresponding to several technological alterative of the stack of thin layers;
- measuring for each reference memory cell an initial resistance value;
- determining for each reference memory cell a programming parameter value selected from among the resistance in a high resistance state and the programming window;
- establishing a relationship between the programming parameter and the initial resistance from the initial resistance values and the programming parameter values;
- determining said at least one value of said at least one manufacturing parameter for which the programming parameter is greater than or equal to a target value, from said relationship between the programming parameter and the initial resistance and from at least one dependency relationship between the initial resistance and said at least one manufacturing parameter.

The determination method according to the first aspect of the invention makes it possible to demonstrate the relationship that exists between the initial resistance of the memory cell and the resistance of the memory cell in the high resistance state or the programming window. Knowing this relationship and the dependency between initial resistance and manufacturing parameter(s), it is possible to determine at least one optimal value of one or more manufacturing parameters of the memory cell.

The programming window of a resistive memory cell may thus henceforth be optimised by adjusting one or more manufacturing parameters of the memory cell, in addition to the programming conditions or the choice of materials.

The manufacturing parameters are thus no longer adjusted as a function of a target value of the forming voltage, but as a function of a target resistance value in the high resistance state or (directly) a target value of the programming window.

Preferably, the determination method comprises the following steps:
  determining, from said relationship between the programming parameter and the initial resistance, at least one initial resistance value for which the programming parameter is greater than or equal to the target value; and
  determining said at least one value of said at least one manufacturing parameter from said at least one initial resistance value.

In a first embodiment of the determination method, the programming parameter is the resistance in the high resistance state and the step of determination of the values of the programming parameter comprises the following operations:
  programming the reference memory cells in the high resistance state;
  measuring for each reference memory cell a resistance value in the high resistance state.

The resistance in the high resistance state is preferably a second degree polynomial function of the logarithm of the initial resistance.

In a second embodiment of the determination method, the programming parameter is the programming window and the step of determination of the values of the programming parameter comprises the following operations:
  programming the reference memory cells in a low resistance state;
  measuring for each reference memory cell a resistance value in the low resistance state;
  programming the reference memory cells in the high resistance state;
  measuring for each reference memory cell a resistance value in the high resistance state; and
  calculating for each reference memory cell a programming window value from the measured resistance values in the low resistance state and the resistance in the high resistance state.

Preferably, the stack of thin layers comprises a first electrode arranged on a substrate, an oxide layer arranged on the first electrode and a second electrode arranged on the oxide layer.

In a preferential embodiment of the determination method, said at least one manufacturing parameter is selected from among the thickness of the second electrode, the thickness of the oxide layer and the proportion of oxygen in the oxide layer.

A second aspect of the invention relates to a method for manufacturing a resistive memory cell. This manufacturing method comprises the following steps:
  determining a value of at least one manufacturing parameter, by following a determination method according to the first aspect of the invention;
  forming on a substrate a stack successively comprising a first electrode, an oxide layer and a second electrode, by applying the value of said at least one manufacturing parameter.

The oxide layer is preferably formed of a sub-stoichiometric silicon oxide ($SiO_x$) or of a porous silicon oxide. In a sub-stoichiometric silicon oxide, the stoichiometric coefficient (x) of oxygen (i.e. the proportion of oxygen) is strictly less than 2.

The first electrode is for example made of titanium nitride and the second electrode is for example made of titanium.

The invention also has the aim of manufacturing an OxRAM type resistive memory cell having a large programming window, the memory cell comprising a silicon oxide layer.

According to a third aspect of the invention, one tends towards this objective by providing a manufacturing method comprising the following steps:
  determining the manufacturing parameter values enabling the resistive memory cell to have an initial resistance comprised between $10^7 \Omega$ and $3 \cdot 10^9 \Omega$, preferably between $3 \cdot 10^7 \Omega$ and $10^9 \Omega$;
  forming on a substrate a stack successively comprising a first electrode, the silicon oxide layer and a second electrode, by applying said manufacturing parameter values.

The manufacturing method according to the third aspect of the invention may also have one or more of the characteristics below, considered individually or according to all technically possible combinations thereof:
  the manufacturing parameters are the thickness of the second electrode, the thickness of the oxide layer and the proportion of oxygen in the oxide layer;
  the silicon oxide is porous and the proportion of oxygen in the silicon oxide layer is comprised between 1.6 and 2, preferably between 1.8 and 1.9;
  the silicon oxide is porous and the thickness of the silicon oxide layer is comprised between 4 nm and 7 nm;
  the silicon oxide is porous and the thickness of the second electrode is comprised between 3 nm and 7 nm;
  the silicon oxide is non-porous and the proportion of oxygen in the silicon oxide layer is comprised between 1 and 1.6, preferably between 1.2 and 1.4;
  the silicon oxide is non-porous and the thickness of the silicon oxide layer is comprised between 3 nm and 4 nm;
  the silicon oxide is non-porous and the thickness of the second electrode is comprised between 4 nm and 6 nm;
  the silicon oxide layer is formed by cathodic sputtering;
  the first and second electrodes are formed by cathodic sputtering; and
  the first electrode is made of titanium nitride and the second electrode is made of titanium.

BRIEF DESCRIPTION OF THE FIGURES

Other characteristics and advantages of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION

Figure 1:
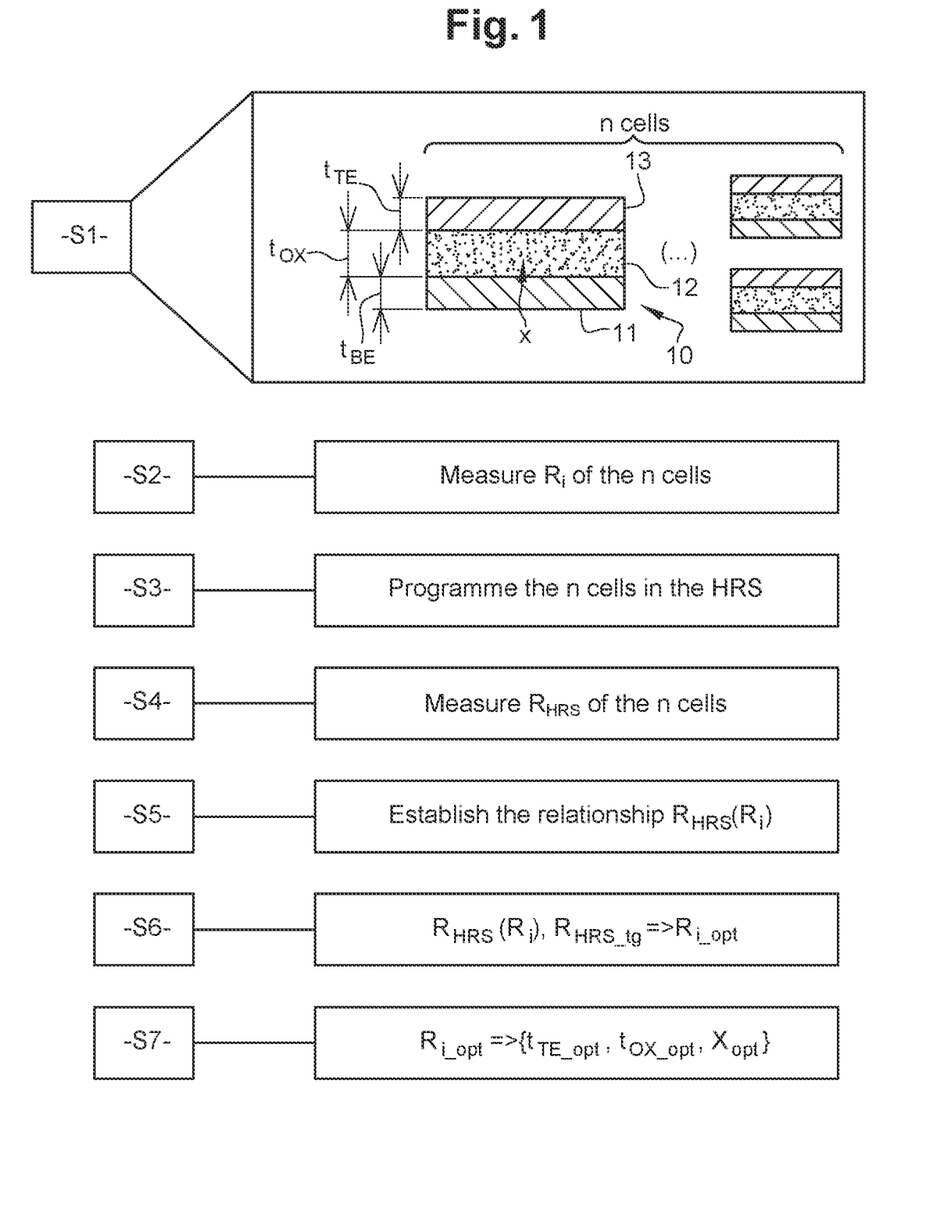
FIG. 1 schematically represents a first embodiment of a method for determining a manufacturing parameter value of a resistive memory cell.

FIG. 1 represents steps S1 to S7 of a method for determining a value of at least one manufacturing parameter of a resistive memory cell, according to a first embodiment of the invention. When the resistive memory cell is manufactured following this parameter value, the programming window of the memory cell reaches a maximum value or a value close to the maximum value. The programming window PW (also called "memory window") of a resistive memory cell is equal to the resistance of the cell in the high resistance state (HRS), hereafter noted $R_{HRS}$, divided by the resistance of the same cell in the low resistance state (LRS), hereafter noted $R_{LRS}$ (PW=$R_{HRS}$/$R_{LRS}$).

The resistive memory cell of which it is sought to improve the programming window comprises a stack of thin layers (each of <100 nm thickness). Conventionally, this stack is formed on a substrate, for example made of silicon, and comprises:
- a first electrode 11 arranged on the substrate and hereafter called "lower electrode";
- a layer of material with variable electrical resistance 12, also called "resistive material", arranged on the first electrode 11; and
- a second electrode 13 arranged on the layer of resistive material and hereafter called "upper electrode".

The resistive memory cell is preferably an oxide-based random access memory cell, commonly called "OxRAM". The resistive material is then an oxide, for example a transition metal oxide (e.g. HfO$_2$, Ta$_2$O$_5$, TiO$_2$ . . . ) or a silicon oxide. The electrodes may be formed of doped silicon, a silicide, a metal (e.g. titanium, tantalum, tungsten . . . ) or a material of metallic nature (also called metallic character), such as titanium nitride (TiN) or tantalum nitride (TaN).

The first step S1 of the method consists in providing a number n of reference memory cells 10, where n is a natural integer greater than or equal to 2, preferably greater than or equal to 20. The greater the number n of reference memory cells 10, the more precise will be the determination method. To avoid needlessly complicating FIG. 1, only three reference memory cells 10 have been represented. The reference memory cells 10 and the resistive memory cell to manufacture comprise a same type of stack of thin layers. The stacks are designated of same type when the number of active layers is identical and the materials used are of same nature. For example, the stack of reference memory cells 10 (and of the resistive memory cell to manufacture) comprises a lower electrode 11 made of titanium nitride, a layer of resistive material 12 made of silicon oxide (SiO$_x$) and an upper electrode 13 made of titanium (TiN/SiO$_x$/Ti type stack).

The reference memory cells 10 differ in the values of their manufacturing parameters. Among these manufacturing parameters may be cited as examples the thickness $t_{OX}$ of the oxide layer 12, the thickness $t_{TE}$ of the upper electrode 13 and the stoichiometric coefficient x of the oxide layer 12 (corresponding to a proportion of oxygen compared to the other elements forming the resistive material). The reference memory cells 10 may have different values of a same manufacturing parameter (for example the thickness $t_{TE}$ of the upper electrode) or different values of several manufacturing parameters. Each reference memory cell 10 is manufactured following a set of manufacturing parameters and at least one manufacturing parameter of each set differs from the other sets of parameters. In this sense, the reference memory cells 10 represent technological alternatives of a same stack of thin layers.

In the case of a TiN/SiO$_x$/Ti type stack, the manufacturing parameters that vary between the n reference memory cells 10 are preferably the thickness $t_{OX}$ of the SiO$_x$ layer 12, the thickness $t_{TE}$ of the upper titanium electrode 13 and the proportion of oxygen x of the SiO$_x$ (the thickness of the lower electrode has no influence on the initial resistance, its thickness is for example of the order of 40 nm). For example, the thickness $t_{OX}$ of the SiO$_x$ layer 12 varies between 1 nm and 20 nm, the thickness $t_{TE}$ of the upper titanium electrode 13 varies between 1 nm and 20 nm and the proportion of oxygen x of the SiO$_x$ varies between 1 and 2. The silicon oxide may thus be sub-stoichiometric (x<2) or silicon dioxide (x=2). The silicon dioxide is preferably porous, whereas the sub-stoichiometric silicon oxide may be porous or non-porous (i.e. exempt of pores).

In the case of a metal/"high-k dielectric material"/metal stack, where the metal of the upper electrode (e.g. Hf, Ti, Ta . . . ) plays the role of oxygen scavenger, also called oxygen getter, for the "high-k" dielectric material (i.e. with high dielectric permittivity, e.g. HfO$_2$, TiO$_2$, Ta$_2$O$_5$ . . . ), the thickness of the layer of "high-k" dielectric material can vary between 1 nm and 20 nm and the thickness of the upper electrode (oxygen scavenger layer) can vary between 1 nm and 20 nm. In the case of a "high-k" dielectric material of metal oxide "MO$_x$" type, where M is a transition metal (e.g. Hf, Ti, Ta . . . ), the proportion of oxygen x may further vary between 1 and a value corresponding to the stoichiometric oxide (x=2 for HfO$_2$ or TiO$_2$, x=2.5 for Ta$_2$O$_5$ . . . ).

The initial resistance $R_i$ of each reference memory cell 10 is next measured during a step S2. The initial resistance is the electrical resistance obtained at the end of the manufacture of the memory cell, before the conductive filament is formed for the first time (in other words, before the "forming" step). The initial resistance $R_i$ may be measured by applying a measuring voltage $U_1$ (for example 100 mV) between the electrodes 11 and 13 of the memory cell 10, by measuring the current $I_1$ of the cell (through the oxide layer 12) subjected to this voltage $U_1$ then by calculating the ratio of the measuring voltage $U_1$ over the measured current $I_1$ ($R_i = U_1/I_1$).

The reference memory cells 10 are next programmed in the high resistance state ("HRS") during a step S3. A first so-called "forming" voltage (for example of the order of 3 V) is applied between the electrodes of the memory cells 10 to activate the resistive material and to place the memory cells 10 in the low resistance state ("LRS"), then a second so-called erasing voltage, of lower absolute value than the first voltage is applied to switch the reference memory cells 10 from the low resistance state to the high resistance state (the erasing voltage is generally negative, for example comprised between −1 V and −2 V).

Then, the resistance in the high resistance state $R_{HRS}$ is measured for each reference memory cell 10 during a step S4. In an analogous manner to the initial resistance $R_i$, the resistance $R_{HRS}$ may be measured by applying a measuring voltage $U_2$ (for example 100 mV) between the electrodes of the memory cell 10 (in the high resistance state), by measuring the current $I_2$ of the cell subjected to this voltage $U_2$ then by calculating the ratio of the measuring voltage $U_2$ over the measured current $I_2$ ($R_{HRS}=U_2/I_2$).

At step S5, a relationship $R_{HRS}(R_i)$ between the resistance in the high resistance state $R_{HRS}$ and the initial resistance $R_i$ is established from the resistance values $R_i$ and resistance values $R_{HRS}$ measured respectively during steps S2 and S4. For example, the resistance values $R_{HRS}$ and $R_i$ of the reference memory cells 10 may be plotted on a graph. Each point of the graph corresponds to a reference memory cell 10 and thus to a technological alternative of the stack (i.e. a combination of technological parameters). The points of the graph are next described, during a so-called "fitting" operation, by a curve or an equation of the type $R_{HRS}=f(R_i)$. The relationship $R_{HRS}(R_i)$ may thus take the form of a curve or an equation. The relationship between the resistance in the high resistance state $R_{HRS}$ and the initial resistance $R_i$ is preferably written in the form of a second degree polynomial, with as variable the logarithm of the initial resistance $R_i$.

Step S6 consists in determining, using the relationship $R_{HRS}(R_i)$, at least one value $R_{i\_opt}$ of the initial resistance $R_i$ for which the resistance in the high resistance state $R_{HRS}$ is greater than or equal to a predetermined target value $R_{HRS\_tg}$. This target value $R_{HRS\_tg}$ may be defined as a function of a target value of the programming window (preferably the maximum) or may be equal to a percentage of the maximum of the resistance in the high resistance state $R_{HRS}$ (for example 90% of the maximum of the resistance $R_{HRS}$). The maximum of the resistance $R_{HRS}$ may be deduced from the relationship $R_{HRS}(R_i)$ established at step S5.

In this first embodiment of the method, the resistance in the low resistance state $R_{LRS}$ of the reference memory cells 10 is assumed constant (and thus independent of technological parameters). Indeed, the resistance $R_{LRS}$ of OXRAM cells programmed in the low resistance state is controlled by the programming current in the low resistance state. For example, for a TiN/SiO$_x$/Ti type stack, the resistance $R_{LRS}$ is equal to around $10^4 \Omega$ when the programming current is equal to around 100 µA. A maximum of the resistance in the high resistance state $R_{HRS}$ then corresponds to a maximum of the programming window.

One value, several distinct values or a range (continuous) of values of the initial resistance $R_i$ may thus be obtained at the end of step S6, depending on the target value selected or the resistance values $R_{HRS}$ taken into consideration (greater than the target value $R_{HRS\_tg}$ and/or equal to the target value $R_{HRS\_tg}$). All of these values may be qualified as "optimal" or "optimised" in so far as they make it possible to approach or even to reach a maximum of the programming window.

Finally, at step S7, at least one optimal value $t_{TE\_opt}/t_{OX\_opt}/x_{opt}$ of one or more manufacturing parameters is determined from the optimal initial resistance value $R_{i\_opt}$ (or optimal values). These manufacturing parameters are not necessarily the same as those that differentiate the reference memory cells 10. They are preferably selected from among the thickness $t_{OX}$ of the oxide layer 12, the thickness $t_{TE}$ of the upper electrode 13 and the proportion of oxygen x in the oxide layer 12.

In a preferential embodiment of step S7, the values of all the manufacturing parameters having an influence on the initial resistance $R_i$ are determined from the optimal initial resistance value $R_{i\_opt}$. In an alternative embodiment, the values of a part only of these manufacturing parameters are determined from the optimal initial resistance value $R_{i\_opt}$. The values of the other manufacturing parameters (including those not having any influence on the initial resistance, for example the thickness $t_{BE}$ of the lower electrode 11, the role of which is to ensure good electrical contact) may be determined in another way. They may notably be imposed by integration constraints.

The optimal value of a manufacturing parameter may be determined from an optimal initial resistance value $R_{i\_opt}$ knowing the dependency of this parameter on the initial resistance $R_i$. For example, the initial resistance $R_i$ of a resistive memory cell increases with the thickness $t_{OX}$ of the oxide layer 12 and with the proportion of oxygen x. Conversely, it decreases when the thickness $t_{TE}$ of the upper electrode 13 increases (up to a certain threshold).

An experimental design may be implemented in order to establish dependency relationships between the initial resistance $R_i$ and the different manufacturing parameters. This experimental design may notably consist in varying the aforementioned three manufacturing parameters (thickness $t_{OX}$ of the oxide layer 12, thickness $t_{TE}$ of the upper electrode 13 and proportion of oxygen x in the oxide layer 12), preferably by combining all the parameter values, and by measuring the initial resistance corresponding to each set of values.

In the case of the TiN/SiO$_x$/Ti stack, the following relationships have been obtained by setting two parameters then by varying the final parameter (with $R_i$ in $\Omega$, x without units, $t_{OX}$ and $t_{TE}$ in nm):

$$\log(R_i)=12.6 \cdot x-16.6 \qquad \text{[Math 1]}$$

with $t_{OX}=t_{TE}=5$ nm.

Thus, equation Math 1 above expresses the variation in the initial resistance $R_i$ as a function of the stoichiometric coefficient x of oxygen and where the thicknesses $t_{OX}$ of the oxide layer 12 and $t_{TE}$ of the upper electrode 13 have been set at 5 nm.

$$R_i=4 \cdot 10^{-6} \times \exp(5.4099 \cdot t_{OX}) \qquad \text{[Math 2]}$$

with $t_{TE}=5$ nm and x=1.8.

Thus, equation Math 2 above expresses the variation in the initial resistance $R_i$ as a function of the thickness $t_{OX}$ of the oxide layer 12 and where the stoichiometric coefficient x of oxygen has been set at 1.8 and the thickness $t_{TE}$ of the upper electrode 13 has been set at 5 nm.

$$R_i=9 \cdot 10^9 \times \exp(-0.97 \cdot t_{TE}) \qquad \text{[Math 3]}$$

with $t_{OX}=5$ nm and x=1.9.

Thus, equation Math 3 above expresses the variation in the initial resistance $R_i$ as a function of the thickness $t_{TE}$ of the upper electrode 13 and where the thickness $t_{OX}$ of the oxide layer 12 has been set at 5 nm and where the stoichiometric coefficient x of oxygen has been set at 1.9.

The above equations have been obtained from experimental values and are dependent on the deposition equipment used.

When several optimal initial resistance values $R_{i\_opt}$ are available, several optimal values of the manufacturing parameter(s) may be obtained.

In a second embodiment of the method, not represented by the figures, it is assumed that the resistance in the low resistance state $R_{LRS}$ of the reference memory cells 10 varies. The method then comprises, in addition to steps S1-S4 described previously, a step of programming the reference memory cells 10 in the low resistance state, a step of measuring the resistance $R_{LRS}$ of the reference memory cells 10 in the low resistance state and a step of calculating the programming windows of the reference memory cells 10 from the measured resistance values $R_{LRS}$ and $R_{HRS}$. The resistance $R_{LRS}$ of the reference memory cells 10 in the low resistance state is advantageously measured before step S3 of programming the reference memory cells 10 in the high resistance state, after the forming step (which thus constitutes the step of programming the reference memory cells 10 in the low resistance state).

Instead of determining a relationship $R_{HRS}(R_i)$ between the resistance in the high resistance state $R_{HRS}$ and the initial resistance $R_i$, at step S5 a relationship is determined between the programming window and the initial resistance. A target value of the programming window is then considered during step S6 (instead of a target value of the resistance in the high resistance state $R_{HRS}$).

An exemplary embodiment of the determination method according to the invention will now be described.

The resistive memory cell of which it is sought to optimise the programming window as well as the reference memory cells 10 provided for this purpose comprise the stack of TiN/SiO$_x$/Ti thin layers described previously.

The silicon oxide is in this example porous and has been obtained by reactive cathodic sputtering in a vacuum deposition chamber. The deposition chamber is equipped with a silicon target and comprises two gas inlets, one for oxygen (O$_2$), the other for a neutral gas such as argon. The sputtering reactor comprises a direct current (DC) voltage generator and a magnetron. The bias of the source supplied by the DC generator is advantageously pulsed. The parameters having an influence on the proportion of oxygen x of the SiO$_x$ are the power applied by the DC generator, the working pressure, the flow rates of the neutral gas and oxygen, the frequency, the ratio $T_{ON}/T_{REV}$ of the duration of the deposition phases ("ON" state of the generator) over the duration of the electrostatic discharge phases ("OFF" state of the generator) and the duty cycle of the pulses of the DC generator (equal to $T_{ON}/(T_{REV}+T_{ON})$).

Figure 2:
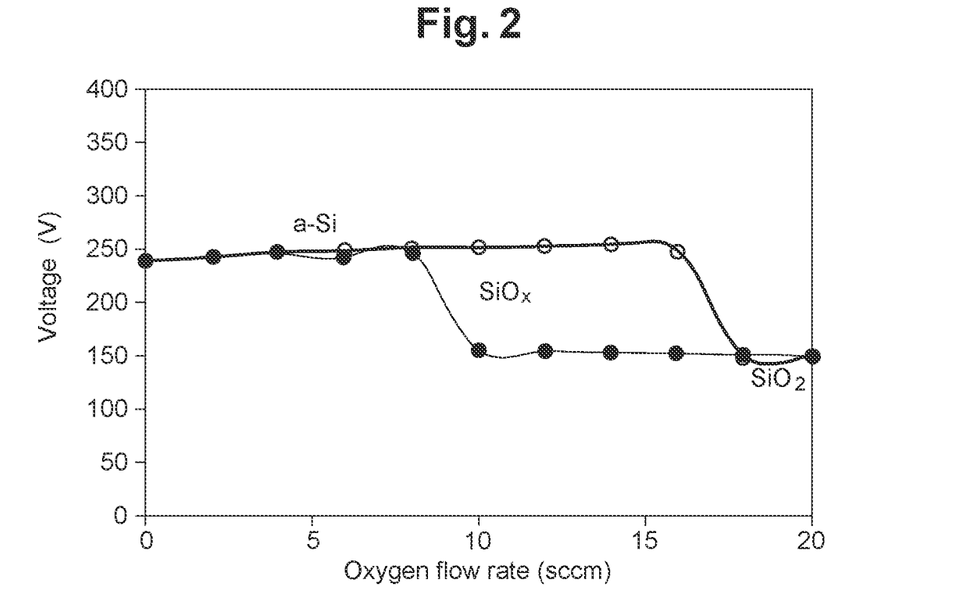
FIG. 2 illustrates different deposition regimes during the sputtering of a silicon source in the presence of oxygen.

FIG. 2 represents the effect of the bias voltage applied to a silicon target (by the DC generator) as a function of the flow rate of oxygen entering into the deposition chamber (expressed in sccm, the abbreviation for "Standard Cubic Centimetres per Minute", i.e. the number of cm$^3$ of gas flowing per minute under standard pressure and temperature conditions, i.e. at a temperature of 0° C. and a pressure of 1013.25 hPa) on the state of the silicon target. The relationship between the bias voltage of the target and the flow rate of oxygen forms a hysteresis that sets the state of the silicon target: amorphous silicon (a-Si) for low flow rates of oxygen (<7 sccm), sub-stoichiometric silicon oxide (SiO$_x$, with x comprised between 1 and 2 excluded) for intermediate flow rates of oxygen (7-18 sccm) and silicon dioxide (SiO$_2$) for high flow rates of oxygen (>18 sccm). The stoichiometry of the silicon oxide deposited may thus be controlled thanks to the flow rate of oxygen entering into the deposition chamber.

Eight reference memory cells have been manufactured following different manufacturing parameter values listed in table 1 below. The stoichiometry x of the SiO$_x$ is controlled via the flow rate of oxygen injected into the chamber. The other deposition parameters are identical between the 8 reference memory cells (temperature in the chamber: 25° C.; power of the DC generator: 1 kW, main flow rate of argon: 50 sccm; flow rate of argon on the rear face of the substrate: 15 sccm; pressure in the chamber: 1 to 3 mTorr depending on the flow rate of oxygen; valve of the cryogenic pump in intermediate position).

TABLE 1

| cell n° | tox (nm) | Flow rate of oxygen $D_{O2}$ (sccm) | Proportion of oxygen x | $t_{TE}$ (nm) | $R_i$ (Ω) | $R_{HRS}$ (Ω) |
|---|---|---|---|---|---|---|
| 1 | 5 | 6 | 1.9 | 5 | 5E6 | 5E4 |
| 2 | 7 | 6 | 1.9 | 5 | 4E10 | 1E5 |
| 3 | 5 | 6 | 1.9 | 7 | 9E7 | 8E5 |
| 4 | 7 | 6 | 1.9 | 7 | 3E10 | 9E4 |
| 5 | 5 | 7 | 2 | 7 | 2E8 | 1E6 |
| 6 | 7 | 5 | 1.8 | 5 | 4E10 | 7E4 |
| 7 | 5 | 7 | 2 | 5 | 1E9 | 1E6 |
| 8 | 5 | 5 | 1.8 | 5 | 3E6 | 1E5 |

Table 1 also gives for these 8 reference memory cells the measured values of the initial resistance $R_i$ and the resistance in the high resistance state $R_{HRS}$. The resistance in the low resistance state $R_{LRS}$ is assumed constant and equal to $10^4 Ω$. The relationship that links the values of flow rate of oxygen $D_{O2}$ (between 4 sccm and 7 sccm) and the values of the proportion of oxygen x is the following:

$$D_{O2}=10 \cdot x-13 \qquad \text{[Math 4]}$$

For a flow rate of oxygen $D_{O2}$ greater than or equal to 7 sccm, the proportion of oxygen x is equal to 2.

Figure 3:
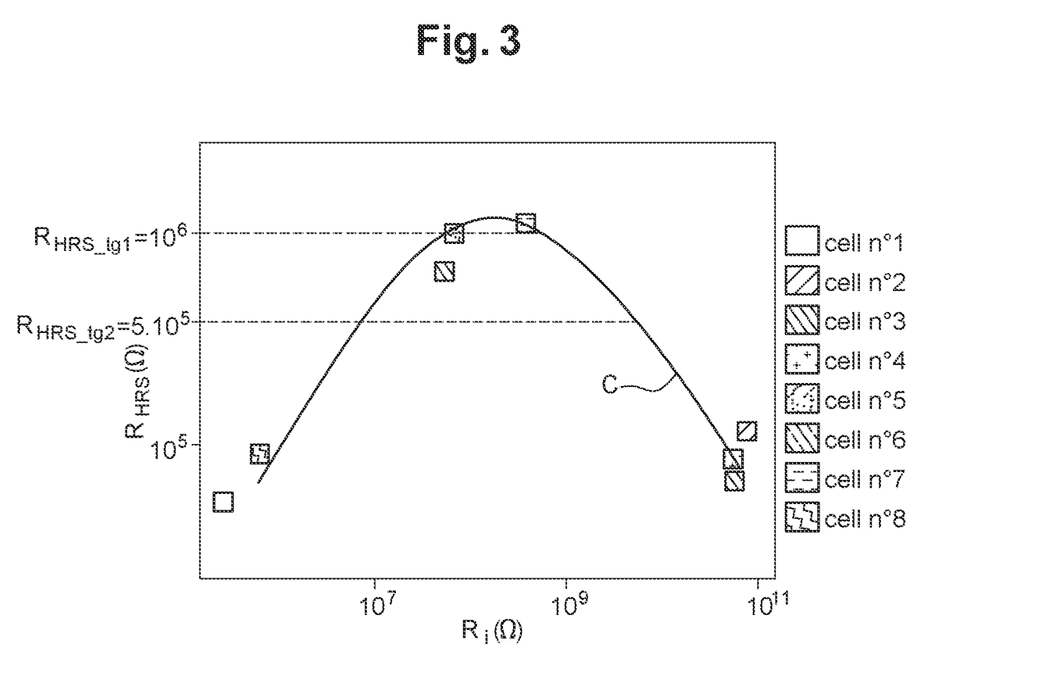
FIG. 3 represents, for a plurality of reference TiN/SiO$_x$/Ti memory cells, the resistance in the high resistance state as a function of the initial resistance.

FIG. 3 is a graph on which have been plotted the measured resistance values $R_i$ and $R_{HRS}$ of the 8 reference memory cells. These points have next been extrapolated by means of a curve C. The equation of curve C (obtained experimentally) is the following:

$$R_{HRS}=-2.2 \cdot 10^5 \cdot (\log(R_i))^2 + 4 \cdot 10^6 \cdot \log(R_i) - 2 \cdot 10^7 \qquad \text{[Math 5]}$$

with $R_i$ and $R_{HRS}$ in Ω.

Curve C, bell or parabolic shaped, shows that there exists a maximum of resistance in the high resistance state $R_{HRS}$—and thus a maximum of the programming window—for an initial resistance $R_i$ of around $10^8 Ω$. An explanation for this bell shaped dependency could be the following: at low initial resistance $R_i$, it is not possible to reach a high resistance value $R_{HRS}$ due to an intrinsic limitation of the resistance of the memory cell. At high initial resistance $R_i$, a high forming voltage is necessary to be able to use the memory cell and this high voltage generates an important quantity of defects in the SiO$_x$ layer. Since the defects are still present during the erasing of the memory cell (return to the high resistance state caused by a dissolution of the conductive filament), the resistance of the high resistance state is reduced.

According to curve C of FIG. 3, an initial resistance $R_i$ comprised between $3 \cdot 10^7 Ω$ and $10^9 Ω$ corresponds to a resistance in the high resistance state $R_{HRS}$ greater than or equal to $R_{HRS\_tg1}=10^6 Ω$. To obtain a programming window greater than or equal to 100, the resistive memory cell (TiN/SiO$_x$/Ti) will thus be manufactured such that its initial resistance $R_i$ is comprised between $3 \cdot 10^7 Ω$ and $10^9 Ω$.

Multiple combinations exist of parameter values to obtain an initial resistance $R_i$ comprised between $3 \cdot 10^7 Ω$ and $10^9 Ω$. As indicated previously, one of these combinations may be obtained by setting a parameter (for integration reasons for example), then by varying the two other parameters. To facilitate the search for an initial resistance $R_i$ comprised between $3 \cdot 10^7 Ω$ and $10^9 Ω$, and given the targeted application, the thickness $t_{OX\_opt}$ of the oxide layer 12 may be set at a value comprised between 4 nm and 7 nm. In an alternative or additional manner, the thickness $t_{TE\_opt}$ of the upper electrode 13 may be set at a value comprised between 3 nm and 7 nm. In an alternative or additional manner, the concentration of oxygen $x_{opt}$ may be set at a value comprised between 1.6 and 2 (i.e. a flow rate of oxygen comprised between 5 sccm and 8 sccm), preferably between 1.8 and 1.9.

Figure 4:
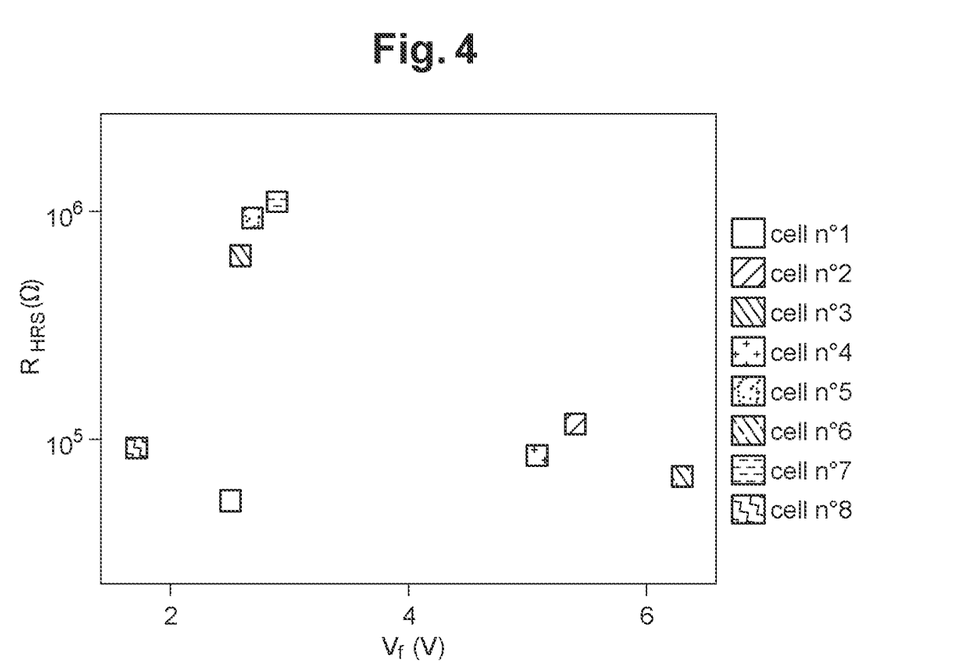
FIG. 4 represents, for the same reference memory cells, the resistance in the high resistance state as a function of the forming voltage.

FIG. 4 represents the resistance values in the high resistance state $R_{HRS}$ of the 8 preceding reference memory cells, associated with the forming voltage values $V_f$ that have been applied to these cells. This figure shows as a comparison that, when the manufacturing parameters are adjusted with the aim of reaching a forming voltage less than or equal to 2 V (typical value to be compatible with the power supply circuit of the memory), a programming window is obtained around ten times less than the maximum programming window (reached for a forming voltage of around 3 V). The determination method according to the invention thus enables a significant improvement of the programming window of resistive memory cells compared to current practice.

Still according to curve C of FIG. 3, an initial resistance $R_i$ comprised between $10^7\Omega$ and $3\cdot10^9\Omega$ corresponds to a resistance in the high resistance state $R_{HRS}$ greater than or equal to $R_{HRS\_tg2}=5\cdot10^5\Omega$. To obtain a programming window greater than or equal to 50, the resistive memory cell (TiN/SiO$_x$/Ti) will thus be manufactured such that its initial resistance $R_i$ is comprised between $10^7\Omega$ and $3\cdot10^9\Omega$.

The silicon oxide SiO$_x$ may also be non-porous and sub-stoichiometric (x<2). To facilitate the search for an initial resistance $R_i$ comprised between $3\cdot10^7\Omega$ and $10^9\Omega$, and given the targeted application, the thickness $t_{OX\_opt}$ of the oxide layer 12 may be set at a value comprised between 3 nm and 4 nm. In an alterative or additional manner, the thickness $t_{TE\_opt}$ of the upper electrode 13 may be set at a value comprised between 4 nm and 6 nm. In an alternative or additional manner, the concentration of oxygen $x_{opt}$ may be set at a value comprised between 1 and 1.6, preferably between 1.2 and 1.4.

More generally, an extrapolation of curve C makes it possible to determine the thickness of the oxide layer $t_{OX}$ (non-porous) for a desired value of R in the following manner: $\log(R_i)=1.1\cdot t_{OX}+0.7$ where the thickness of the upper electrode $t_{TE}$ has been set at 10 nm and where the stoichiometric coefficient x has been set at 1.2.

In the same way, an extrapolation of curve C makes it possible to determine the stoichiometric coefficient x for a desired value of $R_i$ in the following manner: $\log(R_i)=19\cdot x+16$ where the thickness of the oxide layer $t_{OX}$ (non-porous) has been set at 3 nm and where the thickness of the upper electrode $t_{TE}$ has been set at 5 nm.

Another aspect of the invention relates to a method for manufacturing a resistive memory cell, and more particularly an OxRAM memory cell comprising a TiN/SiO$_x$/Ti type stack.

The manufacture of the resistive memory cell successively comprises a step of deposition of the lower electrode 11 on a substrate (for example made of silicon), a step of deposition of the oxide layer 12 on the lower electrode 11 and a step of deposition of the upper electrode 13 on the oxide layer 12. By following at each step the parameter value(s) obtained using the determination method according to the invention, the resistive memory cell will have a large programming window.

The silicon oxide (whether it is porous or non-porous) of the TiN/SiO$_x$/Ti stack may be obtained by cathodic sputtering of a silicon source in the presence of oxygen. The lower titanium nitride electrode and the upper titanium electrode may be formed by cathodic sputtering (reactive in the case of TiN).

It will be noted that the invention is not limited to the embodiments described with reference to the figures and alternatives could be envisaged without going beyond the scope of the invention.

The invention claimed is:

1. A method for determining at least one value of at least one manufacturing parameter of a resistive memory cell, the resistive memory cell comprising a stack of thin layers, said method comprising:
   providing several reference memory cells corresponding to several technological alternatives of the stack of thin layers;
   measuring for each reference memory cell an initial resistance value;
   determining for each reference memory cell a programming parameter value selected from among the resistance in a high resistance state and a programming window;
   establishing an equation that defines a relationship between the programming parameter and the initial resistance from the initial resistance values and from the programming parameter values; and
   after establishing said relationship, determining said at least one value of said at least one manufacturing parameter for which the programming parameter is greater than or equal to a target value, from said relationship between the programming parameter and the initial resistance and from at least one dependency relationship between the initial resistance and said at least one manufacturing parameter.

2. The method according to claim 1, comprising:
   determining, from said relationship between the programming parameter and the initial resistance, at least one initial resistance value for which the programming parameter is greater than or equal to the target value; and
   after determining said at least one initial resistance value for which the programming parameter is greater than or equal to the target value, determining said at least one value of said at least one manufacturing parameter from said at least one initial resistance value.

3. The method according to claim 1, wherein the programming parameter is the resistance in the high resistance state and wherein the determining of the values of the programming parameter comprises the following operations:
   programming the reference memory cells in the high resistance state;
   measuring for each reference memory cell a resistance value in the high resistance state.

4. The method according to claim 3, wherein the resistance in the high resistance state is a second degree polynomial function of the logarithm of the initial resistance.

5. The method according to claim 1, wherein the programming parameter is the programming window and wherein the determining of the values of the programming parameter comprises the following operations:
   programming the reference memory cells in a low resistance state;
   measuring for each reference memory cell a resistance value in the low resistance state;
   programming the reference memory cells in the high resistance state;

measuring for each reference memory cell a resistance value in the high resistance state; and calculating for each reference memory cell a programming window value from the measured resistance values in the low resistance state and the resistance in the high resistance state.

6. The method according to claim 1, wherein the stack of thin layers comprises a first electrode arranged on a substrate, an oxide layer arranged on the first electrode and a second electrode arranged on the oxide layer and wherein said at least one manufacturing parameter is selected from among a thickness of the second electrode, a thickness of the oxide layer and a proportion of oxygen in the oxide layer.

7. The method for manufacturing a resistive memory cell, comprising:

determining a value of at least one manufacturing parameter, by following a method according to claim 1;

forming on a substrate a stack successively comprising a first electrode, an oxide layer and a second electrode, by applying the value of said at least one manufacturing parameter.

8. The method according to claim 7, wherein the oxide layer is formed of a sub-stoichiometric silicon oxide.

9. The method according to claim 7, wherein the oxide layer is formed of a porous silicon oxide.

10. The method according to claim 7, wherein the first electrode is made of titanium nitride and the second electrode is made of titanium.

\* \* \* \* \*